(12) United States Patent
Tsuchiya et al.

(10) Patent No.: US 9,024,518 B2
(45) Date of Patent: May 5, 2015

(54) LIGHT-EMITTING DIODE AND LIGHTING DEVICE INCLUDING THE SAME

(71) Applicants: Citizen Electronics Co., Ltd., Yamanashi-ken (JP); Citizen Holdings Co., Ltd., Tokyo (JP)

(72) Inventors: Kosuke Tsuchiya, Yamanashi-ken (JP); Toshiyuki Mizuno, Yamanashi-ken (JP)

(73) Assignees: Citizen Electronics Co., Ltd., Yamanashi-ken (JP); Citizen Holdings Co., Ltd., Tokyo (JP)

( * ) Notice: Subject to any disclaimer, the term of this patent is extended or adjusted under 35 U.S.C. 154(b) by 0 days.

(21) Appl. No.: 13/885,595

(22) PCT Filed: Feb. 18, 2013

(86) PCT No.: PCT/JP2013/000859
§ 371 (c)(1),
(2) Date: May 15, 2013

(87) PCT Pub. No.: WO2013/121800
PCT Pub. Date: Aug. 22, 2013

(65) Prior Publication Data
US 2014/0152172 A1    Jun. 5, 2014

(30) Foreign Application Priority Data

Feb. 16, 2012   (JP) .................................. 2012-031542
Feb. 16, 2012   (JP) .................................. 2012-031544

(51) Int. Cl.
*H01L 33/50*    (2010.01)
*H01L 33/58*    (2010.01)
*H01L 33/54*    (2010.01)

(52) U.S. Cl.
CPC .............. *H01L 33/507* (2013.01); *H01L 33/54* (2013.01); *H01L 33/58* (2013.01); *H01L 33/505* (2013.01)

(58) Field of Classification Search
CPC ...................................................... H01L 33/507
USPC ................... 313/493, 501, 317, 635; 257/98, 257/E33.005
See application file for complete search history.

(56) References Cited

U.S. PATENT DOCUMENTS

| 6,696,704 B1 | 2/2004 | Maeda et al. |
| 2002/0028527 A1 | 3/2002 | Maeda et al. |
| 2009/0115313 A1* | 5/2009 | Lu et al. ........................ 313/503 |

FOREIGN PATENT DOCUMENTS

| JP | 2000208822 A | 7/2000 |
| JP | 2004039778 A | 2/2004 |
| JP | 2004127604 A | 2/2004 |
| JP | 2007158009 A | 6/2007 |
| JP | 2009032746 A | 2/2009 |

\* cited by examiner

*Primary Examiner* — Elmito Breval
(74) *Attorney, Agent, or Firm* — Browdy and Neimark, PLLC (57) ABSTRACT

In a first aspect of the present invention, a light-emitting diode includes a light-emitting element with a p-n junction, a first light-transmitting member including a phosphor and sealing the light-emitting element, and first and second covers disposed on opposite surfaces of the first light-transmitting member. It is disclosed that the first and second covers extend over edges of the opposite surfaces of the first light-transmitting member. In a second aspect of the present invention, a first cover disposed on a first parallel surface of a first light-transmitting member can be greater in thickness than a second cover. In some embodiments, it is disclosed that a second light-transmitting member with higher diffusion coefficient than the first light-transmitting member is disposed in contact with a first perpendicular surface of the first light-transmitting member.

24 Claims, 7 Drawing Sheets

LIGHT-EMITTING DIODE AND LIGHTING DEVICE INCLUDING THE SAME

TECHNICAL FIELD

The present invention relates to a light-emitting diode, and also relates to a lighting device including a light-emitting diode.

BACKGROUND ART

It is laid open to the public that a light emitting diode includes an element substrate, a light emitting element mounted on the element substrate, a sealing body which emits light from the light emitting element and which seals the light emitting element, and a light shielding means to form light emitting parts for directing light from the sealing body in two dimensional directions which are formed from a combination of either two axes of three dimensional axes X, Y and Z (For reference, see Japanese Unexamined Patent Application Publication No. 2004-127604).

Also, it is laid open to the public that a light emitting device is provided with a light emitting device chip, a transparent member coating the light emitting device chip, and a reflecting member covering the surface of transparent member except surfaces from which light from the light emitting device chip is emitted. The device is formed so that the surface of the transparent member is exposed 180[deg.] or more in an angle when it is seen from the light emitting device chip in at least one plane passing the light emitting device chip (For reference, see Japanese Unexamined Patent Application Publication No. 2004-039778).

SUMMARY OF INVENTION

Technical Problem

In a light-emitting diode and/or a lighting device, varied light from a light-emitting element and from a phosphor included in a light-transmitting member tends to occur, depending on a direction of emitted light. Also, in a light-emitting diode and/or a lighting device with a configuration to emit a wide angle of light emission, light leak in another direction that is unnecessary is required to be prevented.

Solution to Problem

In a first aspect of the present invention, a light-emitting diode includes a light-emitting element with a p-n junction, a first light-transmitting member including a phosphor and sealing the light-emitting element, and first and second covers disposed on opposite surfaces of the first light-transmitting member. It is disclosed that the first and second covers extend over edges of the opposite surfaces of the first light-transmitting member.

In a second aspect of the present invention, a first cover disposed on a first parallel surface of a first light-transmitting member can be greater in thickness than a second cover.

In some embodiments, it is disclosed that a second light-transmitting member with higher diffusion coefficient than a first light-transmitting member is disposed in contact with a first perpendicular surface of a first light-transmitting member. It is also disclosed that the second light-transmitting member with higher diffusion coefficient than the first light-transmitting member further is disposed in contact with a second perpendicular surface of the first light-transmitting member.

It is disclosed that a distance between the p-n junction and the first perpendicular surface of the first light-transmitting member is substantially identical to a distance between the p-n junction and the third perpendicular surface of the first light-transmitting member. It is also disclosed that a distance between the p-n junction and the second perpendicular surface of the first light-transmitting member is substantially identical to the distance between the p-n junction and the third perpendicular surface of the first light-transmitting member.

Furthermore, it is disclosed that the distance between the p-n junction and the first perpendicular surface of the first light-transmitting member is less than the distance between the p-n junction and the third perpendicular surface of the first light-transmitting member. It is also disclosed that the distance between the p-n junction and the second perpendicular surface of the first light-transmitting member is less than the distance between the p-n junction and the third perpendicular surface of the first light-transmitting member.

Advantageous Effects of Invention

An occurrence of varied light from a light-emitting element and from a phosphor included in the light-transmitting member depending on a direction of emitted light can be suppressed. Also, a light-emitting diode and/or a lighting device that is configured to emit light with a wide angle of light emission are suggested.

DESCRIPTION OF EMBODIMENTS

As used herein, the term 'and/or' includes any and all combinations of one or more of the associated listed items.

The terminology used herein is for the purpose of describing particular embodiments only and is not intended to be limiting of the invention. As used herein, the singular forms 'a', an and the are intended to include the plural forms as well, unless the context clearly indicates otherwise.

It will be further understood that the terms 'comprises', 'comprising', 'includes', 'including', has and/or 'having' when used herein, specify the presence of stated features, integers, elements, components, and/or portions of an element, but do not preclude the presence or addition of one or more other features, integers, elements, components, portions, and/or groups thereof.

Furthermore, as used herein, the term 'light-emitting element' may be used as a light-emitting diode (LED) element as a bare chip in some embodiments. The bare chip may be a wafer-level chip. The term 'light-emitting element' may be used as an LED element electrically connected to a leadframe. Also, the term 'light-emitting element' may be used as an LED element electrically connected to a substrate.

The light-emitting element can be selected from light-emitting elements that emit various color of light. For example, the light-emitting element may be a blue light-emitting element. The light-emitting element can be an ultraviolet light-emitting element. Also, the light-emitting element can be a red light-emitting element. Furthermore, the light-emitting element can be a green or yellow light-emitting element.

Relative terms such as 'below' or 'above' or 'upper' or 'lower' may be used herein to describe a relationship of one element, layer, region, or portion to another element, layer, region, or portion as illustrated in the figures. It will be understood that these terms are intended to encompass different orientations of a device in addition to the orientation depicted in the figures.

Embodiments of the invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Embodiments of the invention are described with reference to drawings included herewith. Same and/or similar reference numbers refer to same and/or similar structures throughout. It should be noted that the drawings are schematic in nature.

Figure 1:
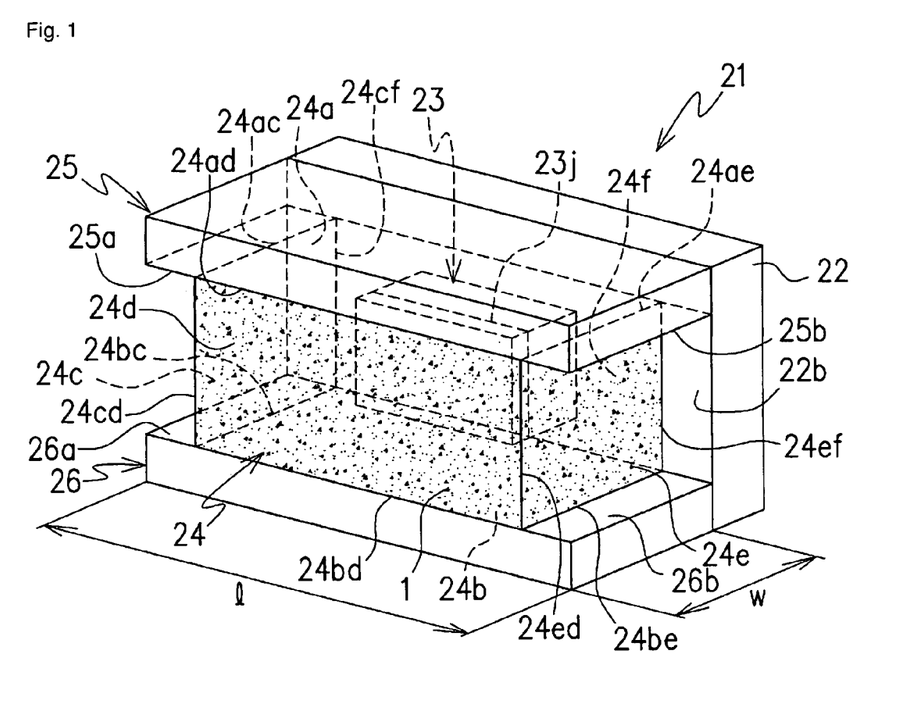
FIG. 1 is a top perspective view of a light-emitting diode (LED) according to a first embodiment of the present invention.

FIG. 1 shows a top perspective view of a light-emitting diode (LED) 21 according to a first embodiment of the present invention. The LED 21 includes a light-emitting element 23 with a p-n junction 23$j$, a first light-transmitting member 24 including a phosphor 1, sealing the light-emitting element 23, and having first and second parallel surfaces 24$a$, 24$b$ that are positioned parallel to each other. The LED 21 further includes a first cover 25 disposed on the first parallel surface 24$a$ of the first light-transmitting member 24, and a second cover 26 disposed on the second parallel surface 24$b$ of the first light-transmitting member 24. The first cover 25 is disposed in contact with the first parallel surface 24$a$ and covers the first parallel surface 24$a$ from above. The second cover 26 is disposed in contact with the second parallel surface 24$b$ and covers the second parallel surface 24$b$ from below, as shown in FIG. 1. The first cover 25 extends over an edge 24$ac$ and/or 24$ae$ of the first parallel surface 24$a$ of the first light-transmitting member 24, and the second cover 26 extends over an edge 24$bc$ and/or 24$be$ of the second parallel surface 24$b$ of the first light-transmitting member 24. The first cover 25 shown in FIG. 1 extends straight along the first parallel surface 24$a$ of the first light-transmitting member 24. The second cover 26 shown in FIG. 1 extends straight along the second parallel surface 24$b$ of the first light-transmitting member 24. The first cover 25 and the second cover 26 extend in opposite directions shown as an arrow 'l' pointing both sides in FIG. 1. The first cover 25 and the second cover 26 may be flush with the first light-transmitting member 24 in opposite directions shown as an arrow 'w' pointing both sides. The arrow 'w' extends perpendicularly to the arrow 'l'.

For more details, the LED 21 of the first embodiment includes the light-emitting element 23 that includes the p-n junction 23$j$, which emits light. The LED 21 further includes the first light-transmitting member 24 that includes the phosphor 1, seals the light-emitting element 23 and has first and second parallel surfaces 24$a$, 24$b$ that are positioned parallel to each other, and first, second, and third perpendicular surfaces 24$c$, 24$e$, 24$d$ that extend perpendicularly to the first and second parallel surfaces 24$a$, 24$b$ between edges 24$ac$, 24$ae$, 24$ad$ of the first parallel surface 24$a$ and edges 24$bc$, 24$be$, 24$bd$ of the second parallel surface 24$b$. The LED 21 of the first embodiment further includes a first cover 25 disposed on the first parallel surface 24$a$ of the first light-transmitting member 24 and a second cover 26 disposed on the second parallel surface 24$b$ of the first light-transmitting member 24. The first cover 25 extends over the edge 24$ac$ between the first parallel surface 24$a$ and the first perpendicular surface 24$c$ of the first light-transmitting member 24 and extends over the edge 24$ae$ between the first parallel surface 24$a$ and the second perpendicular surface 24$e$ of the first light-transmitting member 24. The second cover 26 extends over the edge 24$bc$ between the second parallel surface 24$b$ and the first perpendicular surface 24$c$ of the first light-transmitting member 24 and extends over the edge 24$be$ between the second parallel surface 24$b$ and the second perpendicular surface 24$e$. The p-n junction 23$j$ at a light-emitting surface 23$js$ faces to the third perpendicular surface 24$d$ of the first light-transmitting member 24. The first and second covers 25, 26 may be made of a resin that seals light. The resin may be opaque, for example. The first cover 25 may include a mirror surface that is in contact with the first parallel surface 24$a$ of the first light-transmitting member 24. Furthermore, the second cover 26 may include a mirror surface that is in contact with the second parallel surface 24$b$ of the first light-transmitting member 24. With the mirror surface included in the first cover 25 and/or the second cover 26, light toward upward and/or downward can be used as light emission emitted through the first, second, and third perpendicular surfaces 24$c$, 24$e$, 24$d$ of the first light-transmitting member 24 as lateral light. Accordingly, a wide angle of light emission suppressing loss of light can be achieved.

In this embodiment, light is configured to emit light with a wide angle of light emitted through the third perpendicular surface 24$d$, the first perpendicular surface 24$c$, and the second perpendicular surface 24$e$, which are surrounded by air. As the first cover 25 extends over the edge 24$ac$ between the first parallel surface 24$a$ and the first perpendicular surface 24$c$ of the first light-transmitting member 24 and extends over the edge 24$ae$ between the first parallel surface 24$a$ and the second perpendicular surface 24$e$ of the first light-transmitting member 24, an upward and/or downward light that is emitted through the first perpendicular surface 24$c$ and/or the second perpendicular surface 24$e$ can be reflected by the first cover 25 and/or the second cover 26 to be lateral light. Accordingly, a wide angle of lateral light emission suppressing loss of light can be achieved. Also, light leak in another direction that is unnecessary can be prevented.

The LED 21 may further include a substrate 22 that is positioned at a side opposite to the third perpendicular surface 24$d$ of the first light-transmitting member 24 and electrically connected to the light-emitting element 23. As shown in FIG. 1, the substrate 22 is positioned in contact with a fourth perpendicular surface 24$f$ of the first light-transmitting member 24. The substrate 22 covering the fourth perpendicular surface 24$f$ is arranged flush with the first cover 25 and the second cover 26 at portions in contact with each other. Accordingly, the substrate 22 includes a first extending portion 22$a$ that extends over a side edge 24$cf$ between the first perpendicular surface 24$c$ and the fourth perpendicular surface 24f of the first light-transmitting member 24 and includes a second extending portion 22b that extends over a side edge 24ef between the second perpendicular surface 24e and the fourth perpendicular surface 24f of the first light-transmitting member 24 in opposite directions shown as the arrow '1' pointing both sides in FIG. 1.

In an embodiment of an LED, the light-emitting element 23 may be mounted on a substrate 22. The substrate 22 may be a glass epoxy substrate. The substrate 22 can be made of alumina, which is thermally conductive. Furthermore, the substrate 22 may include a metal that can be thermally connected to the light-emitting element 23. The substrate 22 includes electrodes that are electrically connected to p-electrode and n-electrode of the p-n junction 23j of the light-emitting element 23. The p-electrode and the n-electrode of the light-emitting element 23 may be electrically connected to the electrodes of the substrate 22 by a wire and/or a bump.

Furthermore, the first cover 25 includes a first extending portion 25a that extends over the edge 24ac between the first parallel surface 24a and the first perpendicular surface 24c and includes a second extending portion 25b that extends over the edge 24ae between the first parallel surface 24a and the second perpendicular surface 24e. The second cover 26 includes a first extending portion 26a that extends over the edge 24bc between the second parallel surface 24b and the first perpendicular surface 24c and includes a second extending portion 26b that extends over the edge 24be between the second parallel surface 24b and the second perpendicular surface 24e. Accordingly, light emitted from the light-emitting element 23 is configured to emit light through the first light-transmitting member 24 with a wide angle of lateral light emission closer to 180 degrees.

The distance L2 between the p-n junction 23j at a light-emitting edge 23je of the p-n junction 23j and the first perpendicular surface 24c of the first light-transmitting member 24 may be substantially identical to the distance L1 between the p-n junction 23j at a light-emitting surface 23js of the p-n junction 23j and the third perpendicular surface 24d of the first light-transmitting member 24. Also, the distance L3 between the p-n junction 23j at a light-emitting edge 23je of the p-n junction 23j and the second perpendicular surface 24e of the first light-transmitting member 24 may be substantially identical to the distance L1 between the p-n junction 23j at the light-emitting surface 23js of the p-n junction 23j and the third perpendicular surface 24d of the first light-transmitting member 24.

Furthermore, the distance L2 between the p-n junction 23j at a light-emitting edge 23je and the first perpendicular surface 24c of the first light-transmitting member 24 can be less than the distance L1 between the p-n junction 23j at the light-emitting surface 23js and the third perpendicular surface 24d of the first light-transmitting member 24. Also, the distance L3 between the p-n junction 23j at a light-emitting edge 23je and the second perpendicular surface 24e of the first light-transmitting member 24 can be less than the distance L1 between the p-n junction 23j at the light-emitting surface 23js of the p-n junction 23j and the third perpendicular surface 24d of the first light-transmitting member 24. As the p-n junction 23j faces to the third perpendicular surface 24d of the first light-transmitting member 24 at the light-emitting surface 23js and the p-n junction 23j faces to the first and second perpendicular surfaces 24c, 24e, at light-emitting edges 23je, intensity of light emitted from the p-n junction 23j to the third perpendicular surface 24d is considered to be higher than light emitted from the p-n junction 23j to the first perpendicular surface 24c or to the second perpendicular surface 24e. Accordingly, the first light-transmitting member 24 including the phosphor 1 toward the direction to the first perpendicular surface 24c and/or toward the direction to the second perpendicular surfaces 24e, can be decreased in thickness, compared to the direction toward the third perpendicular surface 24d of the first light-transmitting member 24.

Figure 2:
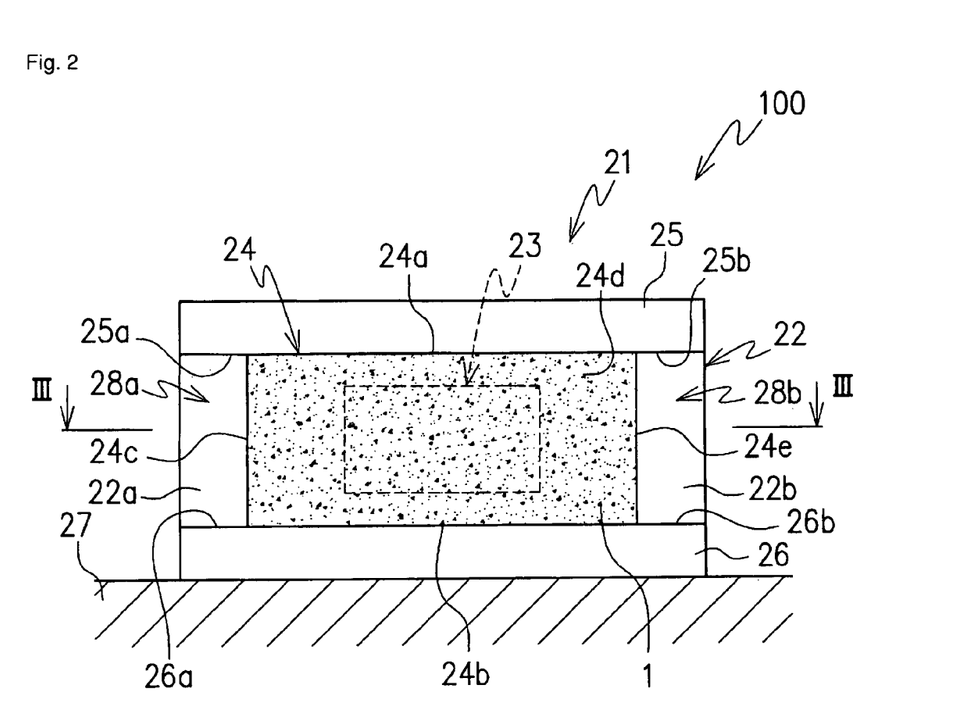
FIG. 2 is a front view of the LED shown in FIG. 1 and mounted on a motherboard of a lighting device.
Figure 3:
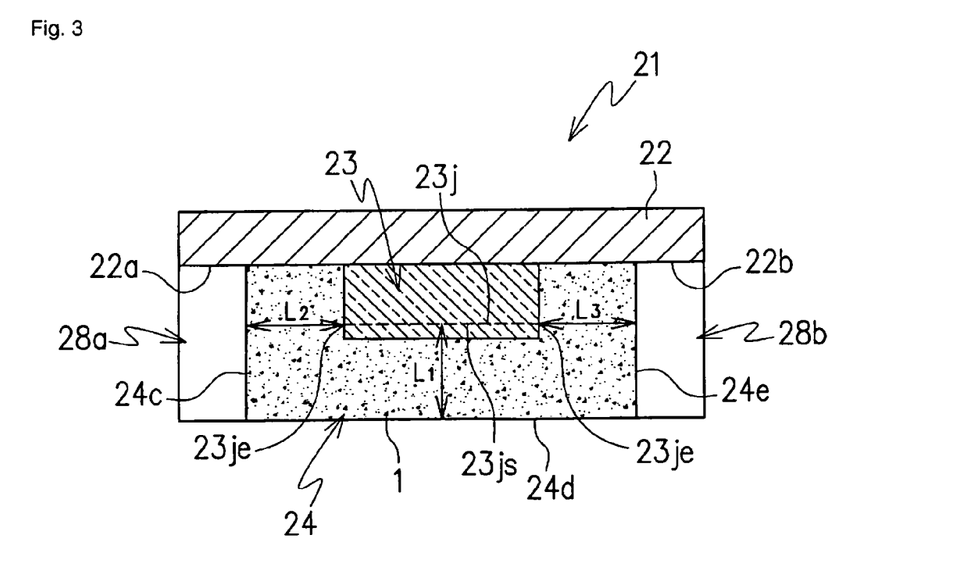
FIG. 3 is a cross-sectional view of the LED taken along the line III-III of FIG. 2.

FIG. 2 shows a front view of the LED 21 shown in FIG. 1 and mounted on a motherboard 27 of a lighting device 100. Also, FIG. 3 shows a cross-sectional view of the LED 21 taken along the line III-III of FIG. 2. The lighting device 100 may be a display device requiring a light source with a wide angle of lateral light emission. Also, the lighting device 100 may be a lighting system requiring a light source with a wide angle of lateral light emission. As shown in FIG. 2, the third perpendicular surface 24d of the first light-transmitting resin 24 may be flush with peripheral side surfaces of the first cover 25 and the second cover 26, but the first and second perpendicular surfaces 24c, 24e of the first light-transmitting resin 24 are positioned inward from the peripheral side surfaces of the first cover 25 and the second cover 26. Accordingly, there is a first space 28a demarcated by the first extending portion 25a of the first cover 25, the first perpendicular surface 24c of the first light-transmitting member 24, the first extending portion 22a of the substrate 22, and the first extending portion 26a of the second cover 26, and there is a second space 28b demarcated by the second extending portion 25b of the first cover 25, the second perpendicular surface 24e of the first light-transmitting member 24, the second extending portion 22b of the substrate 22, and the second extending portion 26b of the second cover 26. When the second cover 26 is mounted on the motherboard 27, the substrate 22 may have a portion that is in contact with or adjacently positioned to the motherboard 27. Accordingly, electricity may be supplied through the motherboard 27 to the substrate 22 and to the light-emitting element 23.

Figure 4:
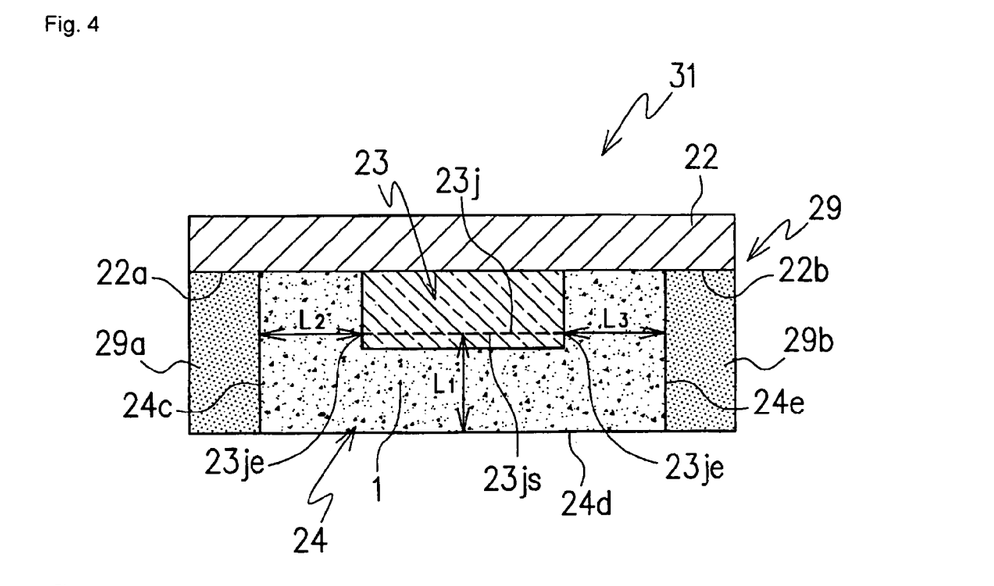
FIG. 4 is a cross-sectional view of an LED according to a second embodiment of the present invention.

FIG. 4 shows a cross-sectional view of an LED 31 according to a second embodiment of the present invention. The LED 31 includes a light-emitting element 23 with a p-n junction 23j, a first light-transmitting member 24 including a phosphor 1, sealing the light-emitting element 23, and having first and second parallel surfaces 24a, 24b that are positioned parallel to each other. The first light-transmitting member 24 may be made of a transparent or translucent resin and include the phosphor 1 that can be excited by light emitted from the light-emitting element 23. The LED 21 further includes a first cover 25 disposed on the first parallel surface 24a of the first light-transmitting member 24, and a second cover 26 disposed on the second parallel surface 24b of the first light-transmitting member 24. The first cover 25 extends over an edge 24ac and/or 24ae of the first parallel surface 24a of the first light-transmitting member 24, and the second cover 26 extends over an edge 24bc and/or 24be of the second parallel surface 24b of the first light-transmitting member 24.

The first and second covers 25, 26 may be made of a resin that seals light. The resin may be opaque, for example. The first cover 25 may include a mirror surface that is in contact with the first parallel surface 24a of the first light-transmitting member 24. The mirror surface can reflect light from the first light-transmitting member 24 back to the first light-transmitting member 24. The mirror surface can be extended to cover the first extending portion 25a and the second extending portion 25b of the first cover 25. Furthermore, the second cover 26 may include a mirror surface that is in contact with the second parallel surface 24b of the first light-transmitting member 24. The mirror surface can be extended to cover the first extending portion 26a and the second extending portion 26b of the second cover 26. With the mirror surface included in the first cover 25 and/or the second cover 26, light toward upward and/or down ward can be emitted through the first, second, and third perpendicular surfaces 24c, 24e, 24d as lateral light. Accordingly, a wide angle of lateral light emission suppressing loss of light can be achieved.

In this embodiment, different from the first embodiment, the LED 31 further includes a second light-transmitting member 29 with higher diffusion coefficient than the first light-transmitting member 24 disposed in contact with the first light-transmitting member 24 between the first cover 25 and the second cover 26. The second light-transmitting member 29 may include a reflective particle. The reflective particle may be made of silicon dioxide ($SiO_2$). The reflective particle may be made of titanium dioxide ($TiO_2$). The second light-transmitting member 29 is disposed in contact with the first perpendicular surface 24c of the first light-transmitting member 24, the first cover 25, and the second cover 26. In other words, the second light-transmitting member 29 is filled in the first space 28a demarcated by the first cover 25, the first perpendicular surface 24c, the substrate 22, and the second cover 26. Also, the second light-transmitting member 29 with higher diffusion coefficient than the first light-transmitting member 24 further is disposed in contact with the second perpendicular surface 24e of the first light-transmitting member 24, the first cover 25, and the second cover 26. In other words, the second light-transmitting member 29 is filled in the second space 28b demarcated by the first cover 25, the second perpendicular surface 24e, the substrate 22, and the second cover 26.

The second light-transmitting member 29 that is disposed in contact with the first perpendicular surface 24c of the first light-transmitting member 24 and the second light-transmitting member 29 that is disposed in contact with the second perpendicular surface 24e of the first light-transmitting member 24 are separately disposed by the first light-transmitting member 24. With the second light-transmitting member 29, light from the light-emitting element 23 and light from the phosphor 1 can be diffused, and therefore it is possible to suppress the occurrence of varied light from the light-emitting element 23 and the phosphor 1. Also, as the second light-transmitting member 29 is sandwiched from above by the first cover 25 and from below by the second cover 26, a wide angle of lateral light emission suppressing loss of light can be achieved.

Figure 5:
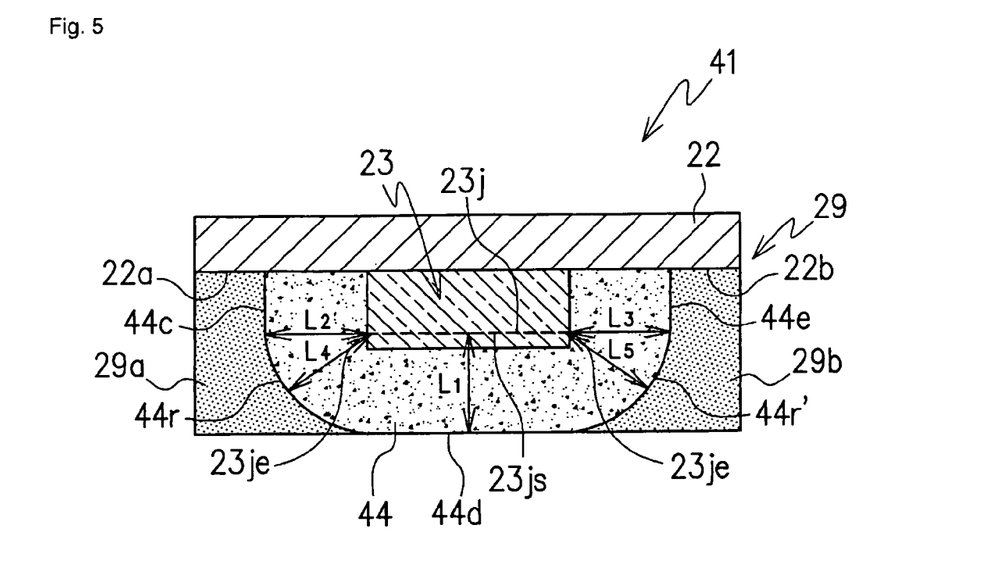
FIG. 5 is a cross-sectional view of an LED according to a third embodiment of the present invention.

FIG. 5 shows a cross-sectional view of an LED 41 according to a third embodiment of the present invention. In this embodiment, the first light-transmitting member 44 is rounded at a side edge between the first perpendicular surface 44c and the third perpendicular surface 44d. Also, the first light-transmitting member 44 is rounded at a side edge between the second perpendicular surface 44e and the third perpendicular surface 44d. In this embodiment, light at the rounded portions of the first light-transmitting member 44 may suppress the occurrence of varied light from the light-emitting element 23 and the phosphor 1 at the side edges. In this embodiment, the distance L4 between the p-n junction 23j at a light-emitting edge 23je and a rounded portion 44r of the first light-transmitting member 44 may be substantially identical to the distance L1. The distance L5 between the p-n junction 23j at a light-emitting edge 23je and a rounded portion 44r' of the first light-transmitting member 44 may be substantially identical to the distance L1.

In this embodiment, a second light-transmitting member 29 (shown as 29a) with higher diffusion coefficient than the first light-transmitting member 44 may be disposed in contact with the first perpendicular surface 44c of the first light-transmitting member 44. The second light-transmitting member 29 may cover to the rounded portion 44r. Also, the second light-transmitting member 29 (shown as 29b) with higher diffusion coefficient than the first light-transmitting member 44 is further disposed in contact with the second perpendicular surface 44e of the first light-transmitting member 44. The second light-transmitting member 29 may cover to the rounded portion 44r'. Accordingly, the first space 28a demarcated by the first extending portion 25a of the first cover 25, the first perpendicular surface 24c, and the first extending portion 26a of the second cover 26 is filled by the second light-transmitting member 29 (shown as 29a) and the second space 28b demarcated by the second extending portion 25b of the first cover 25, the second perpendicular surface 24e, and the second extending portion 26b of the second cover 26 is filled by the second light-transmitting member 29 (shown as 29b).

Figure 6:
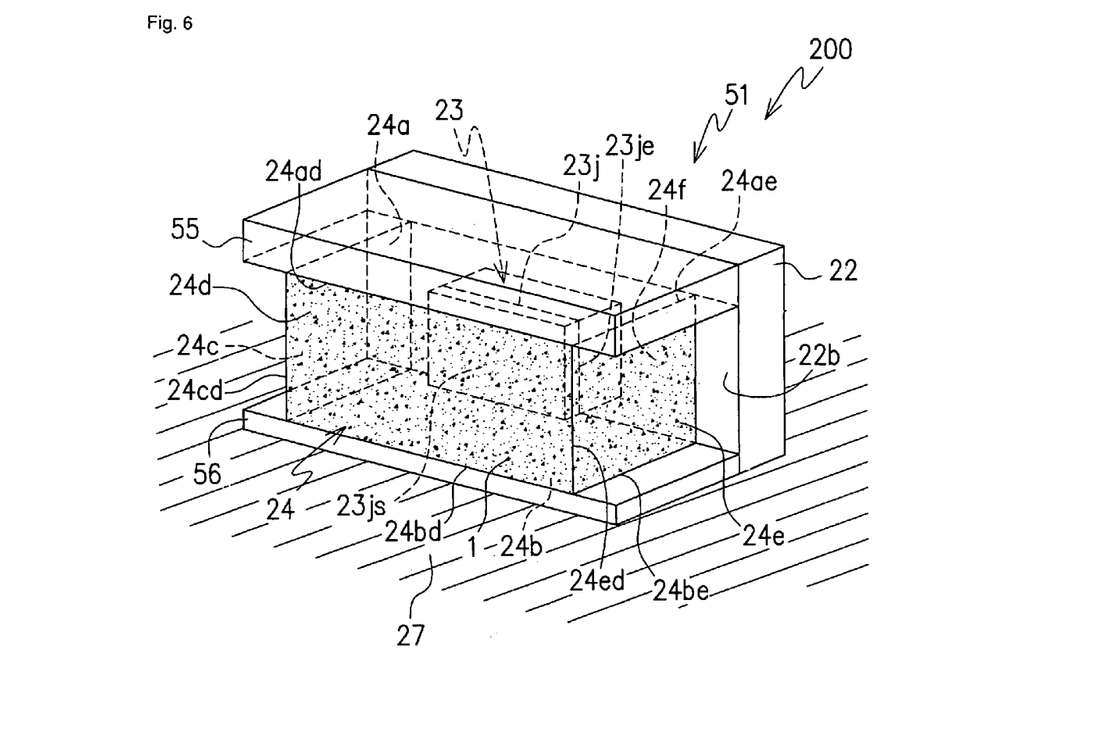
FIG. 6 is a top perspective view of an LED according to a fourth embodiment of the present invention.
Figure 7:
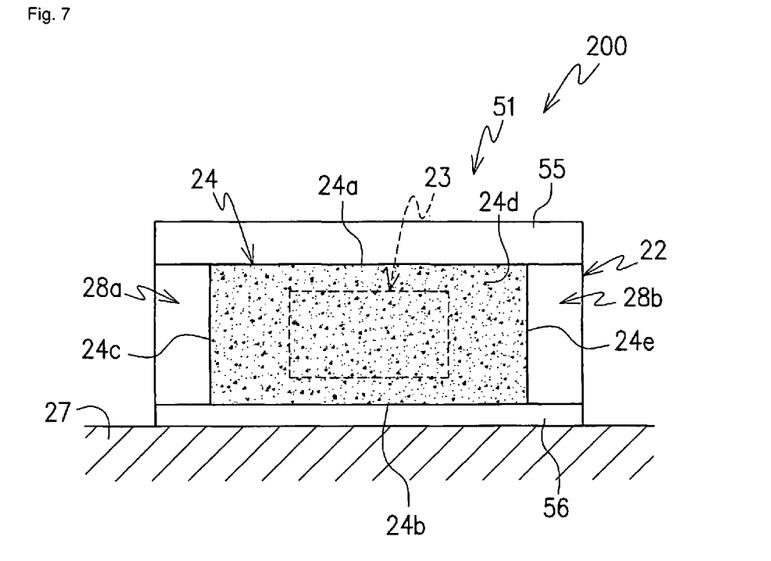
FIG. 7 is a front view of the LED shown in FIG. 6 and mounted on a motherboard of a lighting device.

FIG. 6 shows a top perspective view of an LED 51 according to a fourth embodiment of the present invention. FIG. 7 shows a front view of the LED 51 shown in FIG. 6 and mounted on a motherboard 27 of a lighting device 200. A light-emitting diode (LED) 51 includes a light-emitting element 23 with a p-n junction 23j, a first light-transmitting member 24 including a phosphor 1, sealing the light-emitting element 23, and having first and second parallel surfaces 24a, 24b that are positioned parallel to each other. The LED 51 further includes a first cover 55 disposed on the first parallel surface 24a of the first light-transmitting member 24, and a second cover 56 disposed on the second parallel surface 24b of the first light-transmitting member 24. The first cover 55 extends over an edge 24ac and/or 24ae of the first parallel surface 24a of the first light-transmitting member 24, and the second cover 56 extends over an edge 24bc and/or 24be of the second parallel surface 24b of the first light-transmitting member 24.

In this embodiment, the first cover 55 disposed on the first parallel surface 24a of the first light-transmitting member 24 is greater in thickness than the second cover 56.

When the second cover 56 is disposed on a motherboard 27 of a lighting device 200, light toward the motherboard 27 can be reflected and/or absorbed on the motherboard 27, however light toward the first cover 55 may be partly emitted through the first cover 55, and therefore, the first cover 55 is more thickened than the second cover 56 to prevent a light leak at the first cover 55.

Figure 8:
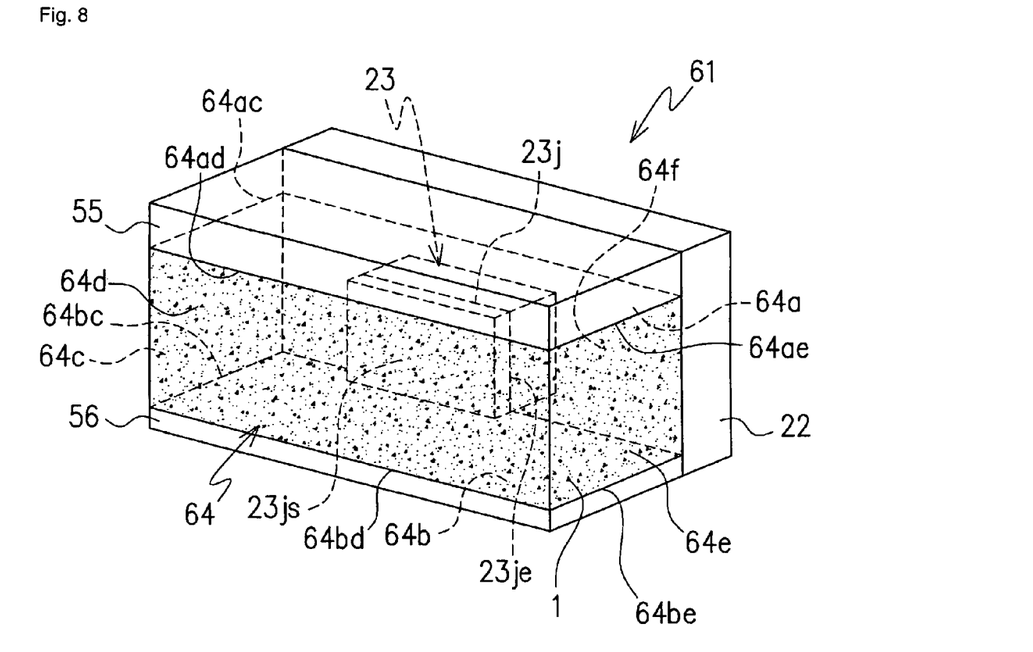
FIG. 8 is a top perspective view of an LED according to a fifth embodiment of the present invention.
Figure 9:
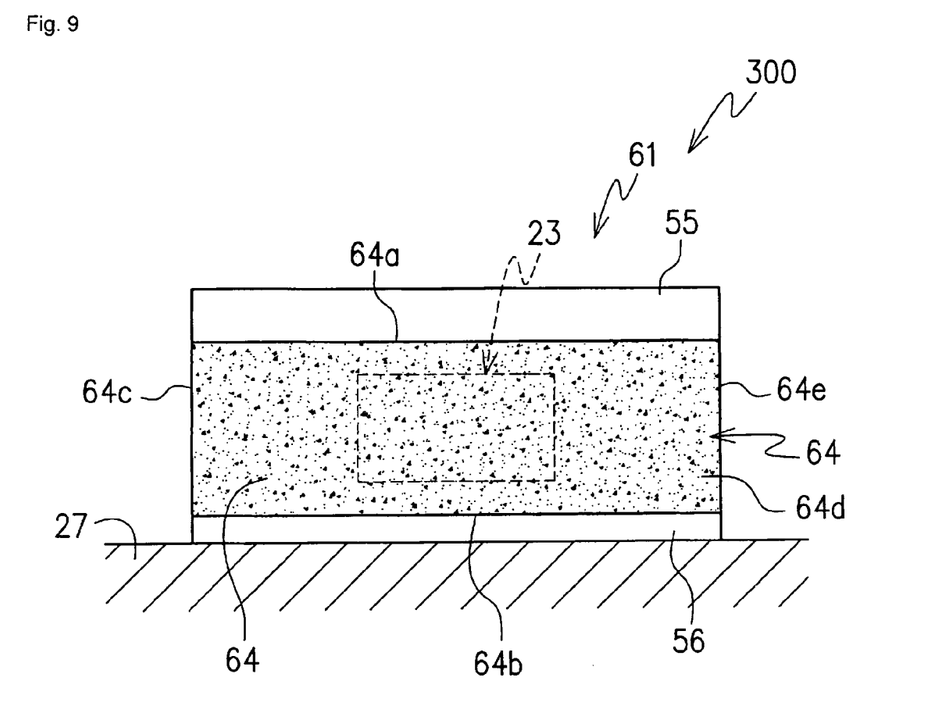
FIG. 9 is a front view of the LED shown in FIG. 8 and mounted on a motherboard of a lighting device.

FIG. 8 shows a top perspective view of an LED 61 according to a fifth embodiment of the present invention, and FIG. 9 shows a front view of the LED 61 shown in FIG. 8 and mounted on a motherboard 27 of a lighting device 300. The LED 61 includes a light-emitting element 23 that includes a p-n junction 23j, and a first light-transmitting member 64 that includes a phosphor 1, seals the light-emitting element 23 and has first and second parallel surfaces 64a, 64b that are positioned parallel to each other, and first, second, and third perpendicular surfaces 64c, 64e, 64d. The first perpendicular surface 64c, the second perpendicular surface 64e, and the third perpendicular surface 64d extend perpendicularly to the first parallel surface 64a and the second parallel surfaces 64b between edges 64ac, 64ae, 64ad of the first parallel surface 64a and edges 64bc, 64be, 64bd of the second parallel surface 64b.

The LED 61 further includes a first cover 55 disposed on the first parallel surface 64a of the first light-transmitting member 64 and a second cover 56 disposed on the second parallel surface 64b of the first light-transmitting member 64. The p-n junction 23j at the light-emitting surface 23js of the light-emitting element 23 faces to the third perpendicular surface 64d of the first light-transmitting member 64. The first cover 55 disposed on the first parallel surface 64a of the first light-transmitting member 64 is greater in thickness than the second cover 56.

In this embodiment, light is configured to be emitted through with a wide angle of lateral light emission through the third perpendicular surface 64d, the first perpendicular surface 64c, and the second perpendicular surface 64e, which are surrounded by air. The LED 61 may further include a substrate 22 that is positioned at a side opposite to the third perpendicular surface 64d of the first light-transmitting member 64 and electrically connected to the light-emitting element 23. With this configuration, light is configured to be emitted as a wide angle of lateral light emission through the third perpendicular surface 64d, the first perpendicular surface 64c, and the second perpendicular surface 64e, which are surrounded by air. The LED 61 may further include a substrate 22 that is positioned at a side opposite to the third perpendicular surface 64d of the first light-transmitting member 64 and electrically connected to the light-emitting element 23. As shown in FIG. 8, the substrate 22 is positioned in contact with a fourth perpendicular surface 64f of the first light-transmitting member 64. The substrate 22 covering the fourth perpendicular surface 64f is arranged flush with the first light-transmitting member 64, first cover 55 and the second cover 56 at adjacent portions in contact with each other.

As shown in FIG. 9, when the second cover 56 is disposed on a motherboard 27 of a lighting device 100, light toward the motherboard 27 can be reflected and/or absorbed on the motherboard 27, however light toward the first cover 55 may be partly emitted through the first cover 55, and therefore, the first cover 55 is thickened more than the second cover 56 that is configured to be positioned adjacent to the motherboard 27.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

INDUSTRIAL APPLICABILITY

A lighting device including an LED according to an embodiment of the present invention may be a display device requiring a light source with a wide angle of light emission. Also, a lighting device including an LED according to an embodiment of the present invention may be a lighting system requiring a light source with a wide angle of light emission.

REFERENCE SIGNS LIST

Light-emitting diode (LED) 21, 31, 41, 51, 61
Light-emitting element 23
p-n junction 23j
Lighting device 100, 200, 300
Phosphor 1
First light-transmitting member 24, 64
Second light-transmitting member 29, 29a, 29b
First cover 25, 55
Second cover 26, 56

CITATION LIST

Patent Literature

Japanese Unexamined Patent Application Publication No. 2004-127604.
Japanese Unexamined Patent Application Publication No. 2004-039778.

The invention claimed is:
1. A light-emitting diode comprising:
a substrate;
a light-emitting element with a p-n junction and electrically mounted on the substrate;
a first light-transmitting member comprising a phosphor, sealing the light-emitting element that is electrically mounted on the substrate, and comprising first and second parallel surfaces that are positioned parallel to each other, and comprising first, second, third perpendicular surfaces that extend perpendicularly to the first and second parallel surfaces between edges of the first parallel surface and edges of the second parallel surface as light-emitting surfaces;
a first cover disposed on the first parallel surface of the first light-transmitting member; and
a second cover disposed on the second parallel surface of the first light-transmitting member,
the substrate being positioned at a side opposite to the third perpendicular surface of the first light-transmitting member, and
the first cover extending over an edge of the first parallel surface of the first light-transmitting member, and
the second cover extending over an edge of the second parallel surface of the first light-transmitting member.
2. The light-emitting diode according to claim 1, wherein the first cover disposed on the first parallel surface of the first light-transmitting member is greater in thickness than the second cover.
3. The light-emitting diode according to claim 1 further comprising:
a second light-transmitting member with higher diffusion coefficient than the first light-transmitting member being disposed in contact with the first light-transmitting member between the first cover and the second cover.
4. The light-emitting diode according to claim 1, wherein the first light-transmitting member is rounded at a side edge between the first perpendicular surface and the third perpendicular surface.
5. The light-emitting diode according to claim 4, wherein the first light-transmitting member is rounded at a side edge between the second perpendicular surface and the third perpendicular surface.

6. A lighting device comprising:
a motherboard; and
the light-emitting diode according to claim 1 with the substrate electrically mounted on the motherboard, and
the second cover of the light-emitting diode being disposed in contact with the motherboard.

7. A light-emitting diode comprising:
a substrate;
a light-emitting element with a p-n junction and electrically mounted on the substrate;
a first light-transmitting member comprising a phosphor, sealing the light-emitting element that is electrically mounted on the substrate, and having first and second parallel surfaces that are positioned parallel to each other, and first, second, and third perpendicular surfaces that extend perpendicularly to the first and second parallel surfaces between edges of the first parallel surface and edges of the second parallel surface as light-emitting surfaces;
a first cover disposed on the first parallel surface of the first light-transmitting member and extending over the edge between the first parallel surface and the first perpendicular surface of the first light-transmitting member and extending over the edge between the first parallel surface and the second perpendicular surface of the first light-transmitting member;
a second cover disposed on the second parallel surface of the first light-transmitting member and extending over the edge between the second parallel surface and the first perpendicular surface of the first light-transmitting member and extending over the edge between the second parallel surface and the second perpendicular surface,
the substrate being positioned at a side opposite to the third perpendicular surface of the first light-transmitting member, and
the p-n junction at a light-emitting surface of the p-n junction facing to the third perpendicular surface of the first light-transmitting member.

8. The light-emitting diode according to claim 3, wherein the first cover disposed on the first parallel surface of the first light-transmitting member is greater in thickness than the second cover.

9. The light-emitting diode according to claim 7 further comprising:
a second light-transmitting member with higher diffusion coefficient than the first light-transmitting member being disposed in contact with the first perpendicular surface of the first light-transmitting member.

10. The light-emitting diode according to claim 9 wherein, the second light-transmitting member with higher diffusion coefficient than the first light-transmitting member is further disposed in contact with the second perpendicular surface of the first light-transmitting member.

11. The light-emitting diode according to claim 10 wherein, the second light-transmitting member disposed in contact with the first perpendicular surface of the first light-transmitting member and the second light-transmitting member disposed in contact with the second perpendicular surface of the first light-transmitting member are separately disposed by the first light-transmitting member.

12. The light-emitting diode according to claim 7, wherein a distance between the p-n junction and the first perpendicular surface of the first light-transmitting member is substantially identical to a distance between the p-n junction and the third perpendicular surface of the first light-transmitting member.

13. The light-emitting diode according to claim 12 further comprising:
a second light-transmitting member with higher light diffusion coefficient than the first light-transmitting member being disposed in contact with the first perpendicular surface of the first light-transmitting member, the first cover, and the second cover.

14. The light-emitting diode according to claim 12, wherein
a distance between the p-n junction and the second perpendicular surface of the first light-transmitting member is substantially identical to the distance between the p-n junction and the third perpendicular surface of the first light-transmitting member.

15. The light-emitting diode according to claim 14 wherein,
a second light-transmitting member with higher light diffusion coefficient than the first light-transmitting member is further disposed in contact with the second perpendicular surface of the first light-transmitting member, the first cover, and the second cover.

16. The light-emitting diode according to claim 7, wherein
a distance between the p-n junction and the first perpendicular surface of the first light-transmitting member is less than a distance between the p-n junction and the third perpendicular surface of the first light-transmitting member.

17. The light-emitting diode according to claim 16 further comprising:
a second light-transmitting member with higher light diffusion coefficient than the first light-transmitting member being disposed in contact with the first perpendicular surface of the first light-transmitting member, the first cover, and the second cover.

18. The light-emitting diode according to claim 16, wherein
a distance between the p-n junction and the second perpendicular surface of the first light-transmitting member is less than the distance between the p-n junction and the third perpendicular surface of the first light-transmitting member.

19. The light-emitting diode according to claim 18 wherein,
a second light-transmitting member with higher light diffusion coefficient than the first light-transmitting member is further disposed in contact with the second perpendicular surface of the first light-transmitting member, the first cover, and the second cover.

20. The light-emitting diode according to claim 7, wherein
the first light-transmitting member is rounded at a side edge between the first perpendicular surface and the third perpendicular surface.

21. The light-emitting diode according to claim 20 further comprising:
a second light-transmitting member with higher light diffusion coefficient than the first light-transmitting member being disposed in contact with the first perpendicular surface of the first light-transmitting member, the first cover, and the second cover.

22. The light-emitting diode according to claim 20, wherein
the first light-transmitting member is rounded at a side edge between the second perpendicular surface and the third perpendicular surface.

23. The light-emitting diode according to claim 22 wherein,
a second light-transmitting member with higher light diffusion coefficient than the first light-transmitting member is further disposed in contact with the second perpendicular surface of the first light-transmitting member, the first cover, and the second cover.

24. A light-emitting diode comprising:
a substrate;
a light-emitting element comprising a p-n junction and electrically mounted on the substrate;
a first light-transmitting member comprising a phosphor, sealing the light-emitting element that is electrically mounted on the substrate, and having first and second parallel surfaces that are positioned parallel to each other, and first, second, and third perpendicular surfaces that extend perpendicularly to the first and second parallel surfaces, between edges of the first parallel surface and edges of the second parallel surface as light-emitting surfaces;
a first cover disposed on the first parallel surface of the first light-transmitting member; and
a second cover disposed on the second parallel surface of the first light-transmitting member,
the substrate being positioned at a side opposite to the third perpendicular surface of the first light-transmitting member, and
the light-emitting element with the p-n junction that is directed to the third perpendicular surface of the first light-transmitting member, and
the first cover disposed on the first parallel surface of the first light-transmitting member being greater in thickness than the second cover.

* * * * *